United States Patent
Zhu et al.

(10) Patent No.: US 12,213,269 B2
(45) Date of Patent: Jan. 28, 2025

(54) DISPLAY PANEL AND SOUND BOX

(71) Applicant: KunShan Go-Visionox Opto-Electronics Co., Ltd., Jiangsu (CN)

(72) Inventors: Zhaoji Zhu, Kunshan (CN); Liwei Ding, Kunshan (CN); Fu Liao, Kunshan (CN); Bo Zhang, Kunshan (CN); Hongqi Hou, Kunshan (CN); Xuebin Li, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 233 days.

(21) Appl. No.: 17/979,431

(22) Filed: Nov. 2, 2022

(65) Prior Publication Data
US 2023/0050183 A1    Feb. 16, 2023

Related U.S. Application Data

(63) Continuation of application No. PCT/CN2021/094624, filed on May 19, 2021.

(30) Foreign Application Priority Data

Aug. 19, 2020  (CN) .......................... 202021738750.6

(51) Int. Cl.
H04R 9/06 (2006.01)
C09J 5/08 (2006.01)
(Continued)

(52) U.S. Cl.
CPC ................. *H05K 5/03* (2013.01); *C09J 5/08* (2013.01); *H04R 1/028* (2013.01); *H04R 2499/15* (2013.01)

(58) Field of Classification Search
CPC .............. H05K 5/03; C09J 5/08; H04R 1/028
See application file for complete search history.

(56) References Cited

U.S. PATENT DOCUMENTS

| | | | | |
|---|---|---|---|---|
| 10,101,524 B2* | 10/2018 | Tanaka | ................. | G02B 6/0088 |
| 2007/0019275 A1* | 1/2007 | Okuda | ................ | G02F 1/13452 |
| | | | | 359/265 |

(Continued)

FOREIGN PATENT DOCUMENTS

| | | |
|---|---|---|
| CN | 203360362 U | 12/2013 |
| CN | 103770386 A | 5/2014 |

(Continued)

OTHER PUBLICATIONS

PCT International Search Report for International Application No. PCT/CN2021/094624, dated Aug. 11, 2021; 7 total pages.

(Continued)

*Primary Examiner* — Simon King
(74) *Attorney, Agent, or Firm* — Rimon PC

(57) ABSTRACT

Disclosed are a display panel and a sound box. The display panel includes a screen body, a cover plate, a protrusion portion, a first adhesive portion and a second adhesive portion. The first adhesive portion is filled between a region of the cover plate exposed from the protrusion portion and the screen body, and the second adhesive portion is filled between the protrusion portion and the screen body, such that no gap is generated between the cover plate and the screen body and between the protrusion portion and the screen body, so as to eliminate bubbles visible to human eyes after a defoaming treatment of the screen body and the cover plate, thereby improving a display effect of the display panel.

15 Claims, 6 Drawing Sheets

(51) Int. Cl.
*H04R 1/02* (2006.01)
*H05K 5/03* (2006.01)

(56) References Cited

U.S. PATENT DOCUMENTS

| | | | |
|---|---|---|---|
| 2009/0081430 A1* | 3/2009 | Husemann | C09J 7/29 |
| | | | 428/212 |
| 2009/0190071 A1 | 7/2009 | Kubota et al. | |
| 2019/0071584 A1 | 3/2019 | Kim et al. | |
| 2021/0111357 A1* | 4/2021 | Kawaguchi | G09F 9/30 |

FOREIGN PATENT DOCUMENTS

| | | |
|---|---|---|
| CN | 203825584 U | 9/2014 |
| CN | 205665676 U | 10/2016 |
| CN | 106459677 A | 2/2017 |
| CN | 304657379 S | 6/2018 |
| CN | 108989958 A | 12/2018 |
| CN | 109144324 A | 1/2019 |
| CN | 109375391 A | 2/2019 |
| CN | 109448542 A | 3/2019 |
| CN | 109955612 A | 7/2019 |
| CN | 209471727 U | 10/2019 |
| CN | 110739409 A | 1/2020 |
| CN | 111009189 A | 4/2020 |
| CN | 213126448 U | 5/2021 |
| JP | 2007178758 A | 7/2007 |

OTHER PUBLICATIONS

PCT Written opinion for International Application No. PCT/CN2021/094624, dated Aug. 11, 2021; 6 total pages.

* cited by examiner

DISPLAY PANEL AND SOUND BOX

CROSS-REFERENCE TO RELATED APPLICATIONS

This application is a continuation of International Application No. PCT/CN2021/094624, filed on May 19, 2021, which claims priority to Chinese Patent Application No. 202021738750.6, filed on Aug. 19, 2020. The entire contents of both applications are incorporated herein by reference in their entireties.

TECHNICAL FIELD

The present application relates to the field of display devices and sound boxes, and in particular, to a display panel and a sound box.

BACKGROUND

To avoid a screen body being scratched during long-term use, a cover plate for protecting the screen body needs to be bonded on a surface of the screen body emitting display light. However, bubbles are easy to be generated between the screen body and the cover plate when bonding the screen body with the cover plate. The bubbles visible to human eyes may not be completely eliminated after a defoaming treatment, thus affecting display effect of the screen body and fitting accuracy.

SUMMARY

In view of this, embodiments of the present application provide a display panel and a sound box to solve a problem of bubbles visible to human eyes which may not be completely eliminated after a defoaming treatment of a screen body and a cover plate, thus affecting a display effect and a fitting accuracy of the screen body.

According to an aspect of the present application, an embodiment of the present application provides a display panel including: a screen body; a cover plate, stacked with the screen body; a protrusion portion, disposed on a surface of the cover plate close to the screen body; a first adhesive portion, filled between a region of the cover plate exposed from the protrusion portion, and the screen body; and a second adhesive portion, filled between the protrusion portion and the screen body.

According to another aspect of the present application, an embodiment of the present application provides a sound box, including: a sound generating device, used for generating sound; a housing, accommodating the sound generating device; and a display panel as described in any one of the above embodiments, which is disposed on a surface of the housing.

The embodiments of the present application provide a display penal and a sound box. By filling a first adhesive portion between a region of a cover plate exposed from the protrusion portion, and a screen body, and filling a second adhesive portion between a protrusion portion and the screen body, the first adhesive portion and the second adhesive portion are completely filled between the cover plate and the screen body and between the protrusion portion and the cover plate. That is, there is no gap between the cover plate and the screen body and between the protrusion portion and the screen body. Therefore, bubbles visible to human eyes may be completely eliminated after a defoaming treatment of the screen body bonded with the cover plate, so as to improve a display effect and a fitting accuracy of the display panel.

DETAILED DESCRIPTION OF THE EMBODIMENTS

The technical schemes in the embodiments of the present disclosure will be described clearly and completely below in combination with the accompanying drawings in the embodiments of the present disclosure. Obviously, the described embodiments are only a part of the embodiments of the present disclosure, not all of the embodiments. Based on the embodiments in the present disclosure, all other embodiments obtained by those skilled in the art without creative efforts shall fall within the protection scope of the present disclosure.

Figure 1A:
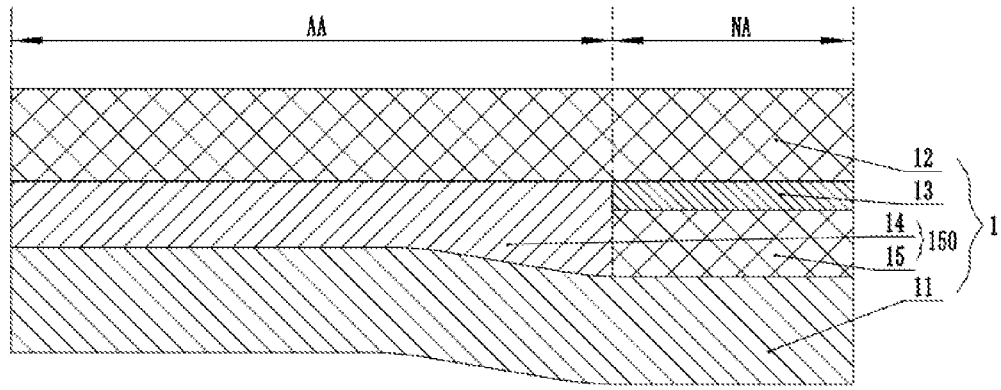
FIG. 1a is a schematic structural diagram of a display penal according to an embodiment of the present application.

As shown in FIG. 1a, a display penal 1 includes: a screen body 11, a cover plate 12, a protrusion portion 13, a first adhesive portion 14 and a second adhesive portion 15.

The screen body 11 may include a light-emitting device and a driver device. The light-emitting device is used to emit display light, such as liquid crystal display (LCD) screen, light-emitting diode (LED) display screen or organic light-emitting diode (OLED) display screen or the like. OLED display screen includes rigid screen and flexible screen; the driver device is used to drive the light-emitting device to emit display light, such as a liquid crystal driving circuit or a thin film transistor driving circuit.

In an embodiment, the screen body 11 may be a flexible screen body, which may be bent according to an appearance of an attached object, adapt to various appearance shapes and improve user experience. The screen body 11 may also be a rigid screen, and a type of screen 11 may be selected according to different application scenarios as long as being capable of meeting a display function. The type of the screen body 11 is not specifically limited in the present application.

As shown in FIG. 1a, the cover plate 12 is stacked with the screen body 11. A material of the cover plate 12 may be acrylic or other transparent materials. The material of the cover plate 12 may be selected according to different application scenarios, as long as being transparent. The material of cover plate 12 is not specifically limited in the present application.

As shown in FIG. 1a, the protrusion portion 13 is provided on a surface of the cover plate 12 close to the screen body 11. The protrusion portion 13 may be a protrusion formed on a surface of the cover plate 12 by painting, silk screen printing or pad printing or a protrusion formed on the surface of the cover plate 12 by other processes. A forming process of the protrusion portion 13 may be selected according to specific needs. The forming process of the protrusion 13 is not specifically limited in the present application.

In an embodiment of the present application, a thickness of the protrusion portion 13 ranges from 0.05 mm to 0.2 mm for shading and decorating, and meanwhile raw materials will not be wasted to save costs.

In an embodiment of the present application, a material of the protrusion portion 13 may be ink or paint. The material of the protrusion portion 13 may be selected according to different application scenarios, as long as playing a role of shading and decoration. The material of the protrusion portion 13 is not specifically limited in the present application.

In an embodiment of the present application, the screen body 11 includes a display area AA and a non-display area NA surrounding the display area and used for wiring. A projection of the protrusion portion 13 on a plane of the cover plate 12 may be a rectangular frame. A projection of the protrusion portion 13 on a plane of the screen body 11 may cover the non-display area of the screen body 11.

As shown in FIG. 1a, the first adhesive portion 14 is disposed between the cover plate 12 and the screen body 11, and covers a region of the cover plate 12 exposed from the protrusion portion 13, and the second adhesive portion 15 is filled between the protrusion portion 13 and the screen body 11.

In an embodiment of the present application, a material of the first adhesive portion 14 may be a transparent adhesive to facilitate light emitted by the screen body 11 to pass through the first adhesive portion 14 and the cover plate 12. A material of the second adhesive portion 15 may be a transparent adhesive or an opaque adhesive, as long as the protrusion portion 13 and the screen body 11 may be bonded. The material of the first adhesive portion 14 and the second adhesive portion 15 is not specifically limited in the present application.

In an embodiment of the present application, the first adhesive portion 14 may be optical adhesive and the second adhesive portion 15 may be a foam tape. Transparent optical adhesive may transmit light emitted by the screen body 11, while the foam tape may bond the protrusion portion 13 and the screen body 11, and a price of the foam tape is lower than that of transparent adhesive with light transmission function, saving production costs.

It can be seen that by filling the first adhesive portion 14 between the region of the cover plate 12 exposed from the protrusion portion 13, and the screen body 11 and filling the second adhesive portion 15 between the protrusion portion 13 and the screen body 11, the first adhesive portion 14 and the second adhesive portion 15 are completely filled between the cover plate 12 and the screen body 11 and between the protrusion portion 13 and the screen body 11, that is, there is no gap between the protrusion portion 13 and the screen body 11 and between the cover plate 12 and the screen body 11. Thus, bubbles visible to human eyes may be completely eliminated after a defoaming treatment, so as to improve a display effect and a fitting accuracy of the display panel.

In an embodiment, the first adhesive portion 14 and the second adhesive portion 15 may be made of same material and may be transparent adhesive, so that the first adhesive portion 14 and the second adhesive portion 15 may be an integrated structure and the first adhesive portion 14 and the second adhesive portion 15 may be prepared as a whole, simplifying a process. At the same time, since the first adhesive portion 14 and the second adhesive portion 15 may be the integrated structure, the first adhesive portion 14 and the second adhesive portion 15 are seamlessly connected. When the screen body is bent, the first adhesive portion 14 and the second adhesive portion 15 are not easy to break, thereby improving reliability of bonding.

Figure 1B:
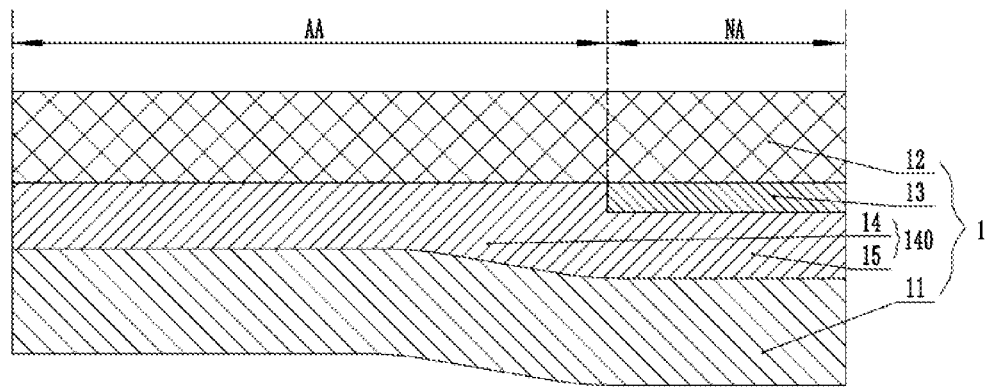
FIG. 1B is a schematic structural diagram of a display penal according to another embodiment of the present application.

In an embodiment, as shown in FIG. 1B, the first adhesive portion 14 and the second adhesive portion 15 may be an integrated structure 140, and the bonding may be realized by performing a defoaming treatment on the integrated structure. A thickness of the integrated structure before the defoaming treatment may be larger than or equal to a protrusion height of the protrusion portion 13, so that after the defoaming treatment, the adhesive layer may be fully filled in the gap between the cover plate 12 and the screen body 11 and between the protrusion portion 13 and the screen body 11. Thus, the first adhesive portion 14 filled between the region of the cover plate 12 that is not covered by the protrusion portion 13 and the screen body 11 and the second adhesive portion 15 filled between the protrusion portion 13 and the screen body 11 are formed.

Specifically, the defoaming treatment is to soften the optical adhesive at a certain temperature to make the optical adhesive have fluidity, and then break up bubbles through a certain pressure into small bubbles invisible to human eyes or discharge the bubbles out of the adhesive layer. For example, the cover plate 12 bonded with the screen body 11 may be maintained at a temperature of 50° and a pressure of 500 mp for half an hour, so as to achieve a purpose of defoaming.

In an embodiment, the first adhesive portion 14 and the second adhesive portion 15 are two individual structures 150, and a thickness of the first adhesive portion 14 is larger than that of the second adhesive portion 15, so as to reduce a height difference between the screen body 11 and the cover plate 12 caused by the protrusion portion 13, making a surface of the cover plate 12 more flat after bonding the cover plate 12 and the screen body 11, and improving user experience.

Figure 2:
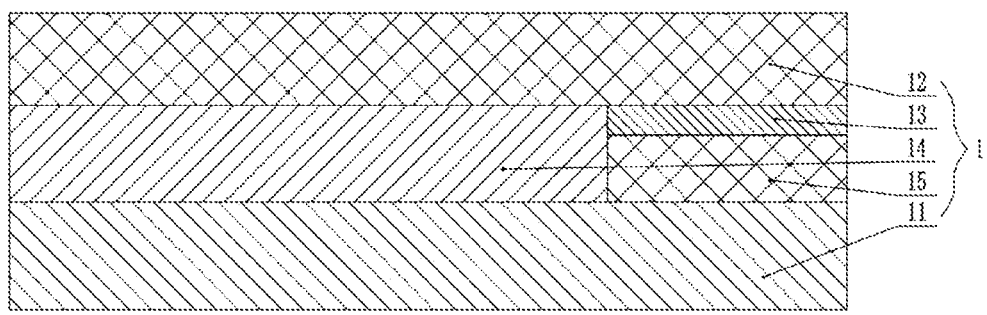
FIG. 2 is a schematic structural diagram of a display penal according to another embodiment of the present application.

As shown in FIG. 2, a sum of the height of the protrusion portion 13 and a thickness of the second adhesive portion 15 is equal to a thickness of the first adhesive portion 14, so that there is no gap between the screen body 11 and the cover plate 12 after bonding, so that bubbles visible to human eyes may not be generated after the defoaming treatment. At the same time, the screen body 11 may be maintained in a flat state without bending to fit with the cover plate 12, making an appearance more beautiful after fitting and improving user experience.

Figure 3:
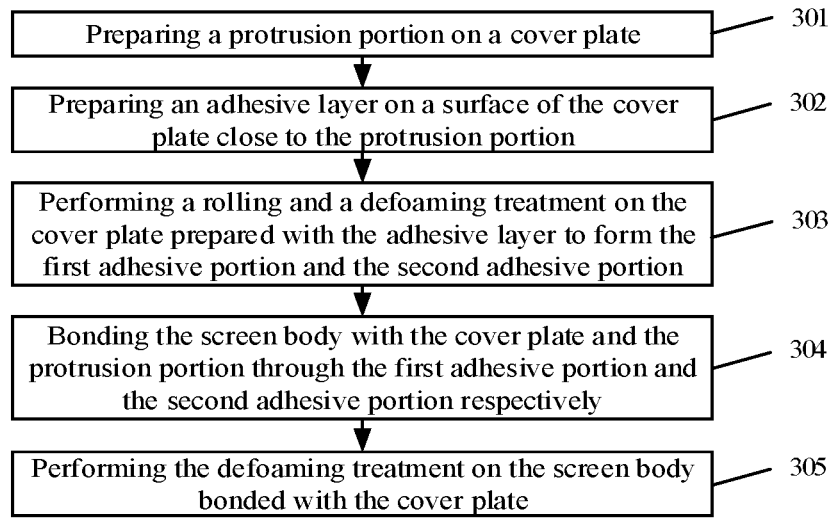
FIG. 3 is a schematic flowchart of a display penal preparation method according to an embodiment of the present application.

As shown in FIG. 3, steps of a preparation method of the display penal 1 is as follows.

301: forming a protrusion portion 13 on a cover plate 12.

Specifically, a protrusion may be formed on a surface of the cover plate 12 through painting, silk screen printing or pad printing, and may also be formed on the surface of the cover plate 12 through other processes. A formation process of the protrusion portion 13 may be selected according to specific needs. The formation process of the protrusion portion 13 is not specifically limited in the present application.

A thickness of painting, silk screen printing or pad printing of the protrusion portion 13 ranges from 0.05 mm and 0.2 mm, which may not only play a role of shading and decoration, but also save materials of painting, silk screen printing or pad printing and save costs.

A material of the protrusion portion 13 may be ink or paint. The material of the protrusion portion 13 may be selected according to different application scenarios, as long as being capable of playing a role of shading and decoration. The material of protrusion portion 13 is not specifically limited in the present application.

302: preparing an adhesive layer 16 on a surface of the cover plate 12 close to the protrusion portion 13.

Figure 4:
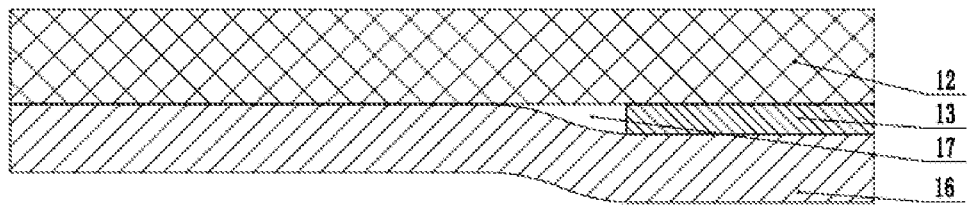
FIG. 4 is a schematic structural diagram of an adhesive layer prepared on a surface of a cover plate close to a protrusion portion according to an embodiment of the present application.

Specifically, a material of the adhesive layer 16 may be transparent adhesive. As shown in FIG. 4, a thickness of the adhesive layer 16 is larger or equal to a protrusion height of the protrusion portion 13. After a defoaming treatment, the adhesive layer 16 may be completely filled in a gap 17 between the cover plate 12 and the screen body 11. For example, the protrusion height of the protrusion portion 13 is smaller than 0.05 mm, and the thickness of the adhesive layer 16 ranges from 0.05 mm to 0.5 mm. After the defoaming treatment, the adhesive layer 16 may be fully filled in the gap 17 between the cover plate 12 and the screen body 11.

In an embodiment, for that the material of the adhesive layer 16 being different, if the protrusion height of the protrusion portion 13 is larger than 0.2 mm, the gap 17 may not be completely filled even though the thickness of the adhesive layer 16 is larger than 0.5 mm. In this situation, the adhesive layer 16 needs to be further processed to form the first adhesive portion 14 and the second adhesive portion 15 to overcome the above problems.

303: performing a rolling and a defoaming treatment on the cover plate 12 prepared with the adhesive layer 16 to form the first adhesive portion 14 and the second adhesive portion 15.

The rolling is a pretreatment of the cover plate 12 prepared with the adhesive layer 16 before the defoaming treatment, that is, by applying a certain pressure to the cover plate 12 prepared with the adhesive layer 16, some bubbles may be extruded out of the gap 17 between the adhesive layer 16 and the cover plate 12.

As shown in FIG. 4, since the protrusion portion 13 has been prepared on the cover plate 12, when the adhesive layer 16 is prepared on the surface of the cover plate 12 close to the protrusion portion 13, the gap 17 will be generated by the adhesive layer 16 at a junction of the protrusion portion 13 and the region exposed from the protrusion portion 13. If the thickness of the adhesive layer 16 is smaller than the protrusion height of the protrusion portion 13, the adhesive layer 16 may not completely fill the gap 17 between the cover plate 12 and the screen body 11 after the rolling and the defoaming treatment. When the thickness of the adhesive layer 16 is larger than or equal to the protrusion height of the protrusion portion 13, the adhesive layer 16 may have fluidity at a certain temperature, pressure and time during the rolling and the defoaming treatment on the cover plate 12 prepared with the adhesive layer 16, and enough adhesive flows into the gap 17, so as to completely fill the gap 17 at the junction of the protrusion portion 13 and the region exposed from the protrusion portion 13. Thus, bubbles generated by bonding may change into small bubbles invisible to human eyes or be discharged out of the gap 17.

304: bonding the screen body 11 with the cover plate 12 and the protrusion portion 13 through the first adhesive portion 14 and the second adhesive portion 15 respectively.

305: performing the defoaming treatment on the screen body 11 bonded with the cover plate 12.

Specifically, when the screen body 11 is bonded with the cover plate 12 through the first adhesive portion 14 and the second adhesive portion 15, bubbles will also be generated between the screen body 11 and the first adhesive portion 14 and between the screen body 11 and the second adhesive portion 15. Therefore, the defoaming treatment is also required.

In an embodiment, the first adhesive portion 14 and the second adhesive portion 15 may be integrally formed through the adhesive layer 16, then cut into the separated first adhesive portion 14 and the second adhesive portion 15, and then bonded and fitted to the cover plate 12 or the screen body 11 at the gap 17. It is also applicable to directly prepare the first adhesive portion 14 and the second adhesive portion 15 on the cover plate 12 or the screen body 11. The present application does not specifically limit the preparation method of the first adhesive portion 14 and the second bonding part 15.

In an embodiment, the material of the first adhesive portion 14 and the second adhesive portion 15 may be the same or different. The materials of the first adhesive portion 14 and the second adhesive portion 15 is not specifically limited in the present application.

Figure 5:
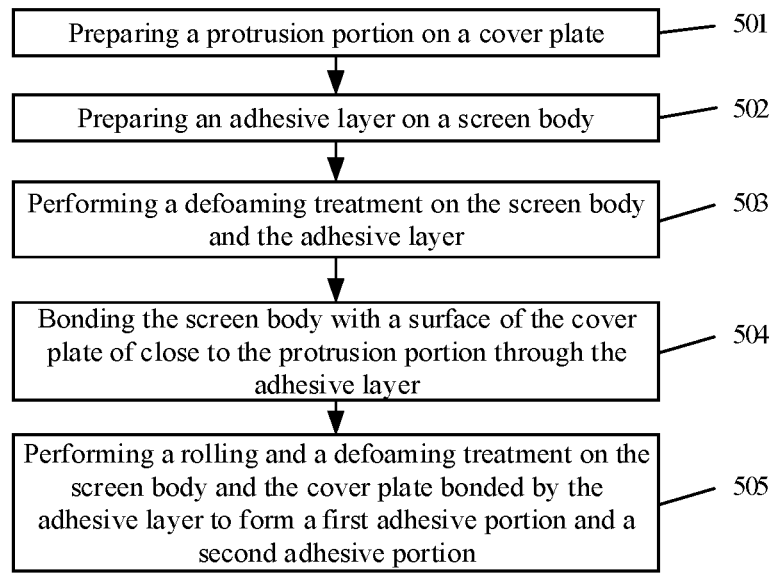
FIG. 5 is a schematic flowchart of a display penal preparation method according to another embodiment of the present application.

A difference between the embodiment shown in FIG. 5 and the embodiment shown in FIG. 3 is that, the adhesive layer 16 is firstly prepared on the cover plate 12 and then fitted with the screen body 11 in the embodiment shown in FIG. 3, while in the embodiment shown in FIG. 5 the adhesive layer 16 is firstly prepared on the screen body 11 and then fitted with the cover plate 12. The specific steps of the preparation method of the display panel 1 in the embodiment shown in FIG. 5 are as follows.

501: preparing a protrusion portion 13 on a cover plate 12.

502: preparing an adhesive layer 16 on a screen body 11.

503: performing a defoaming treatment on the screen body 11 and the adhesive layer 16.

Specifically, when the adhesive layer 16 is prepared on the screen body 11, bubbles will also be generated between the screen body 11 and the adhesive layer 16. Therefore, the defoaming treatment is also required.

504: bonding the screen body 11 with a surface of the cover plate 12 of close to the protrusion portion 13 through the adhesive layer 16.

505: performing a rolling and a defoaming treatment on the screen body 11 and the cover plate 12 bonded by the adhesive layer 16 to form a first adhesive portion 14 and a second adhesive portion 15.

Figure 6:
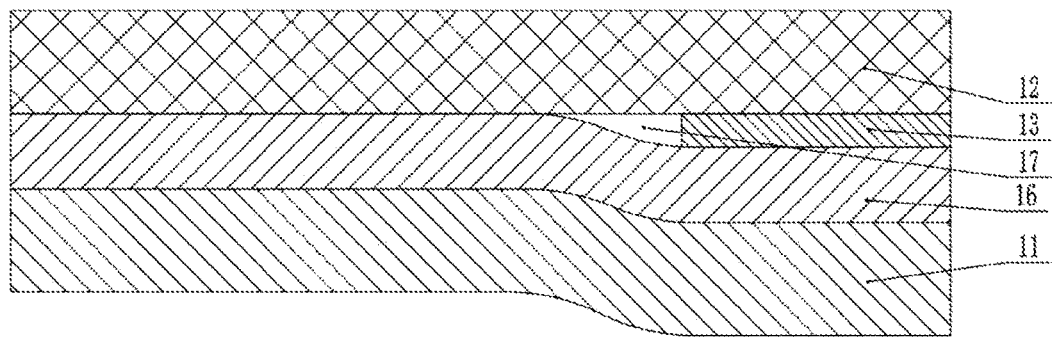
FIG. 6 is a schematic structural diagram illustrating a screen body bonded with a surface of a cover plate close to a protrusion portion through an adhesive layer according to an embodiment of the present application.

Specifically, as shown in FIG. 6, since the protrusion portion 13 has been prepared on the cover plate 12, when the screen body 11 is bonded to the surface of the cover plate 12 close to the protrusion portion 13 through the adhesive layer 16, a gap 17 may be generated at a junction of the protrusion portion 13 and the region exposed from the protrusion 13. If the thickness of the adhesive layer 16 is smaller than the protrusion height of the protrusion portion 13, the gap 17 between the cover plate 12 and the screen body 11 may not be completely filled by the adhesive layer 16 after the rolling and the defoaming treatment. When the thickness of the adhesive layer 16 is larger than or equal to the protrusion height of the protrusion portion 13, the adhesive layer 16 may have fluidity under a certain temperature, pressure and time during the rolling and the defoaming treatment on the cover plate 12 prepared with the adhesive layer 16, and enough adhesive flows into the gap 17, so as to completely fill the gap 17 at the junction of the protrusion portion 13 and the region exposed from the protrusion portion 13. Thus, the bubbles generated by bonding may change into small bubbles invisible to human eyes or be discharged out of the gap 17.

In an embodiment, the first adhesive portion 14 and the second adhesive portion 15 may be integrally formed on a substrate, and bonded to the cover plate 12 or the screen body 11 after being cut into the first adhesive portion 14 and the second adhesive portion 15 separately. The first adhesive portion 14 and the second adhesive portion 15 may also be prepared directly on the cover plate 12 or the screen body 11 respectively. The preparation method of the first adhesive portion 14 and the second adhesive portion 15 is not specifically limited in the present application.

In an embodiment, the materials of the first adhesive portion 14 and the second adhesive portion 15 may be the same or different. The materials of the first adhesive portion 14 and the second adhesive portion 15 is not specifically limited in the present application.

Figure 7:
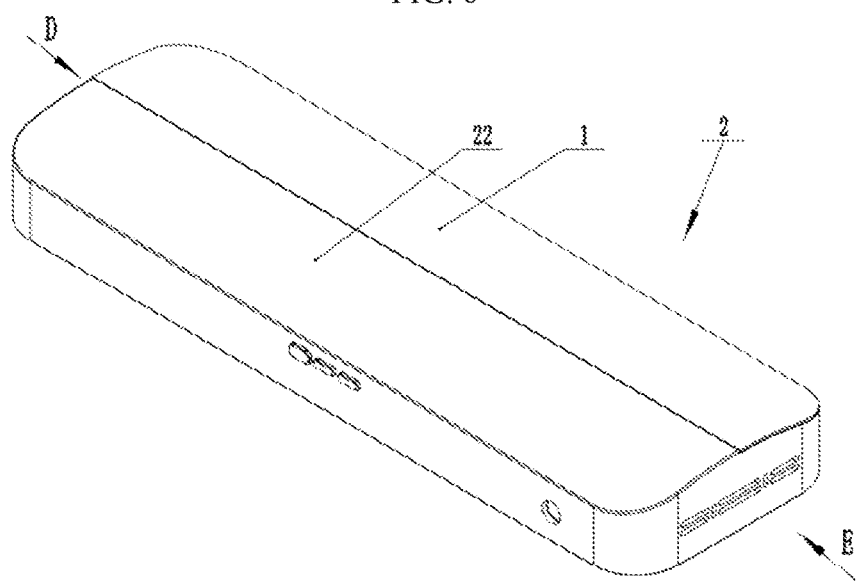
FIG. 7 is a schematic structural diagram of a sound box according to an embodiment of the present application.
Figure 8:
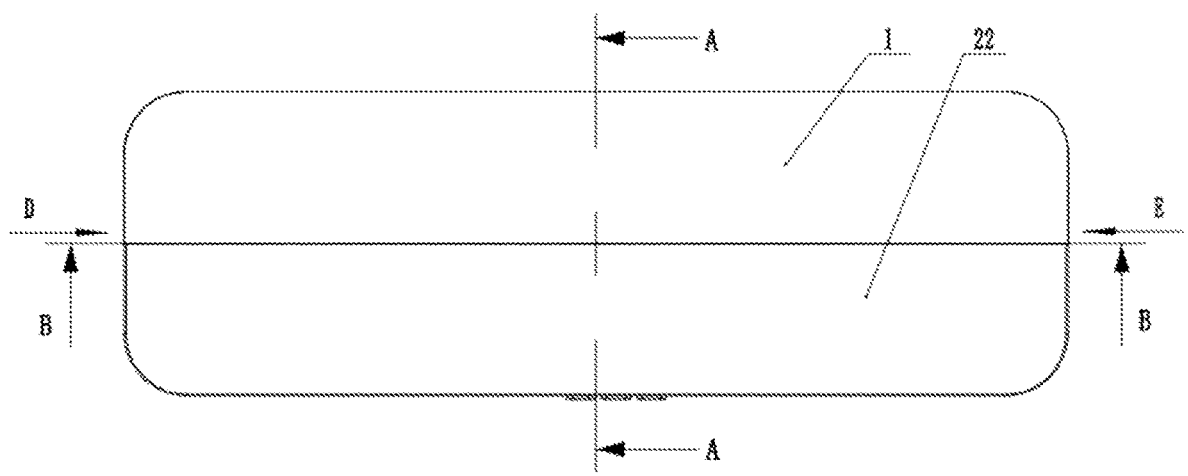
FIG. 8 is a top view of a sound box according to another embodiment of the present application.

As shown in FIG. 7, a sound box 2 includes: a sound generating device, a housing 22 and a display panel 1 according to any one of the above embodiments.

Specifically, the sound generating device is used for generating sound. The housing 22 is used for accommodating the sound generating device. The display panel 1 is disposed on a surface of the housing 22 for displaying interactive information with a user.

By attaching the display panel 1 to the surface of the housing 22 of the sound box 2, parameters of human-computer interaction may be displayed to improve an effect of the human-computer interaction and the user experience. At the same time, there are no bubbles on the surface of the display panel 1, which improves the display effect of the display panel 1 and further improves the user experience.

As shown in FIG. 8, FIG. 9, FIG. 10 and FIG. 11, the sound generating device 21 includes: at least one electromagnetic vibration exciter 211, a soundboard 212 and a soft rubber pad 213.

Specifically, the electromagnetic vibration exciter 211 is used for generating vibration. The soundboard 212 is fitted with the electromagnetic vibration exciter 211 for transmitting the vibration generated by the electromagnetic vibration exciter 211. The soft rubber pad 213 is bonded with a surface of the soundboard 212 of one side away from the electromagnetic vibration exciter 211, used for generating resonant sound with the soundboard 212.

Specifically, the soundboard 212 and the soft rubber pad 213 are bonded through an adhesive layer 214. The soundboard 212 may be an acrylic board, a carbon fiber board or a honeycomb board. The material of the soundboard 212 is not specifically limited in the present application.

Figure 9:
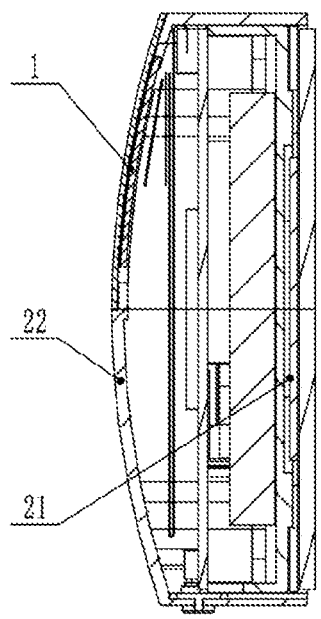
FIG. 9 is a cross-sectional view of the sound box in A-A direction in the embodiment shown in FIG. 8.
Figure 10:
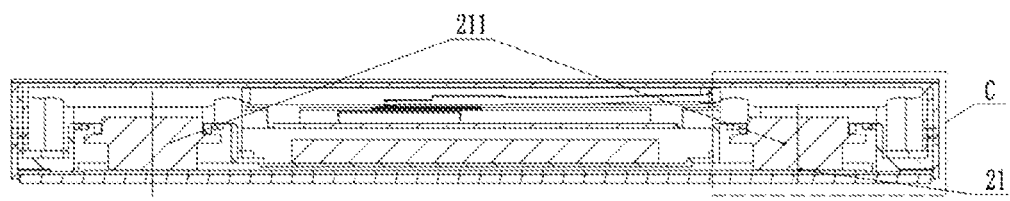
FIG. 10 is a cross-sectional view of the sound box in B-B direction in the embodiment shown in FIG. 8.
Figure 11:
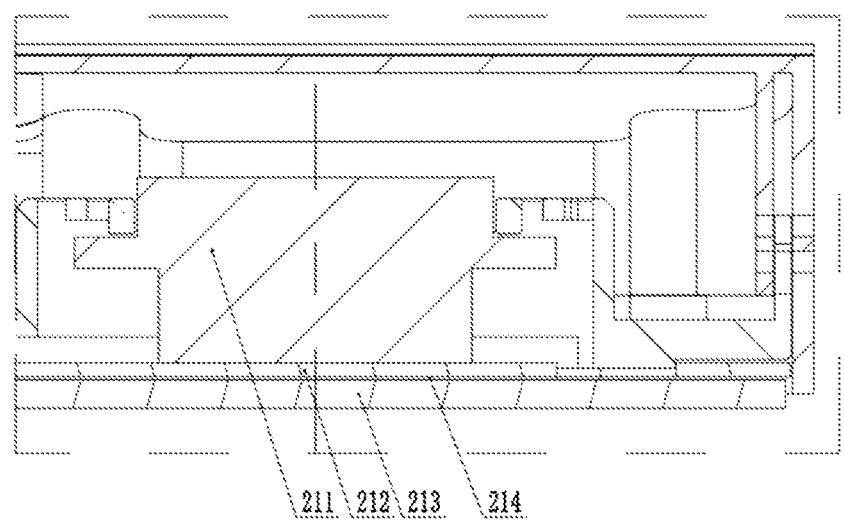
FIG. 11 is a partially enlarged view of the sound box at part C in the embodiment shown in FIG. 10.
Figure 12:
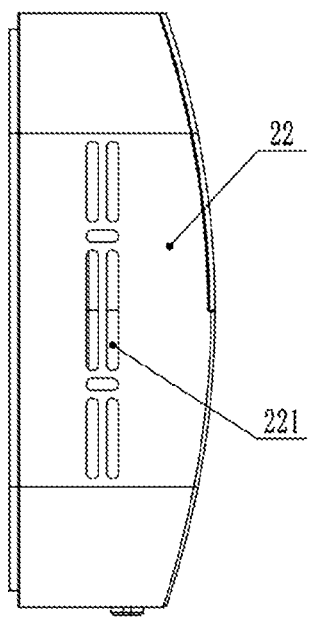
FIG. 12 is a side view of the sound box in D direction in the embodiment shown in FIG. 8.
Figure 13:
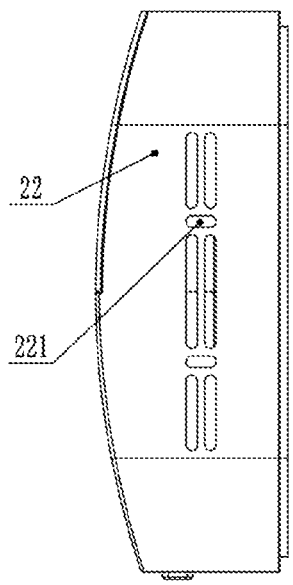
FIG. 13 is a side view of the sound box in E direction in the embodiment shown in FIG. 8.

In an embodiment, as shown in FIG. 9, the screen body 11 may be a flexible screen body, and may be fitted with the housing 22 in a shape of a curved surface, so as to make an appearance of the sound box 2 more beautiful.

In an embodiment, as shown in FIG. 10, FIG. 11, FIG. 12 and FIG. 13, the sound generating device 21 includes two electromagnetic vibration exciters 211, which are respectively located at both ends of the housing 22. The housing 22 includes a plurality of holes 221, which are distributed on surfaces of both ends of the housing 22. The sound volume and quality are improved through the holes 221 on both ends of the sound box 2.

Figure 14:
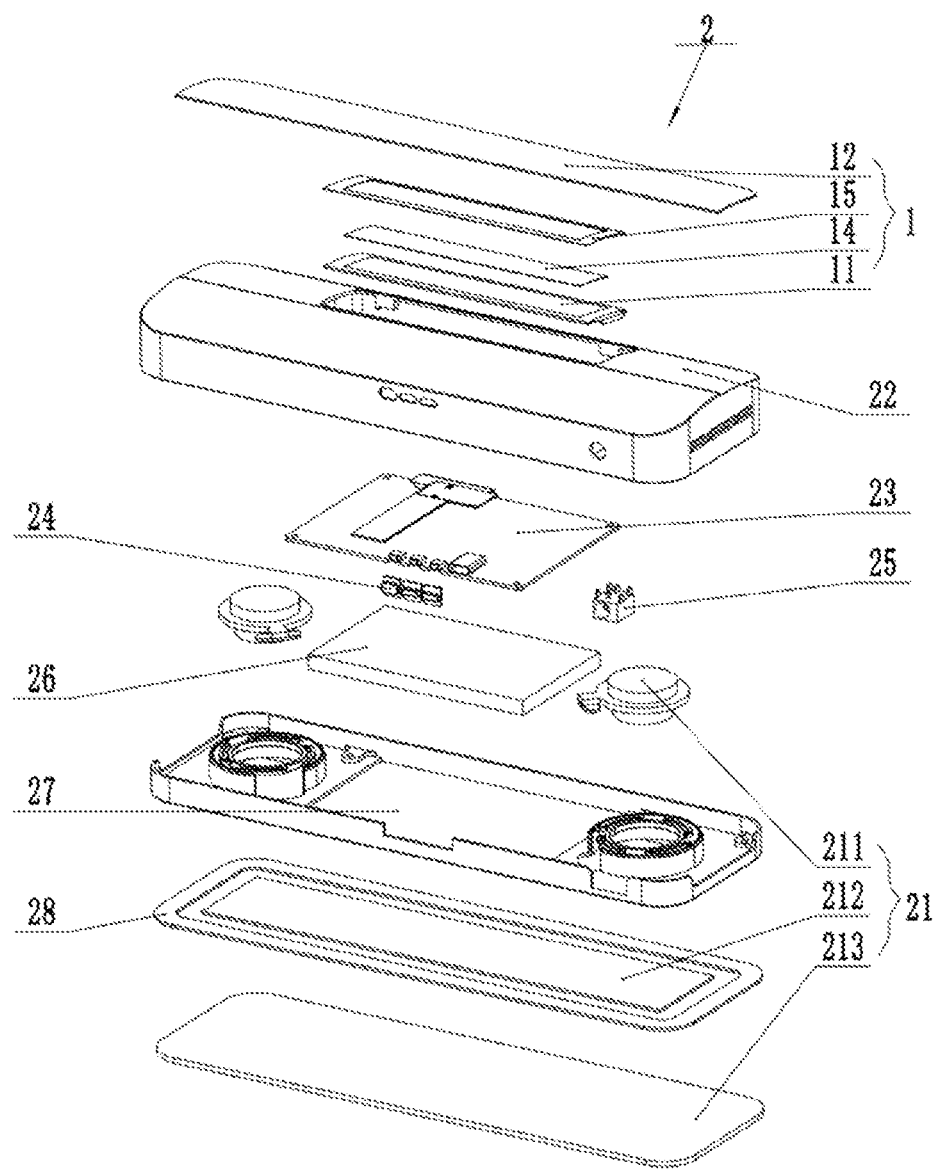
FIG. 14 is an exploded view of a sound box according to another embodiment of the present application.

As shown in FIG. 14, the sound box 2 includes a display panel 1, a sound generating device 21, a housing 22, a main board 23, a key 24, a charging interface 25, a battery 26, a lower cover 27, a fastener 28 and various connecting wires.

Specifically, the display panel 1 includes a cover plate 12, a protrusion portion, a second adhesive portion 15, a first adhesive portion 14 and a screen body 11. The connection or positional relationship between the components of the display panel is shown in the above embodiments and will not be repeated here.

The sound generating device 21 is used to generate sound. The electromagnetic vibration exciter 211 of the sound generating device 21 is located in the housing 22 and passes through the lower cover 27 to fit with the soundboard 212 of the sound generating device 21. The soundboard 212 is bonded with the soft rubber pad 213 through the adhesive layer 214. The electromagnetic vibration exciter 211 generates vibration and transmits the vibration to the soundboard 212, which resonates with the soft rubber pad 213 bonded together.

As a control part of the sound box 2, the main board 23 is electrically connected with the sound generating device 21, the key 24, the charging interface 25 and the battery 26 to control each component to complete their respective functions. The key 24 includes a power key and a volume key for switching on and off and adjusting the volume. The charging interface 25 is used to electrically connect with an external power supply to charge the battery 26. The battery 26 is used to store electric energy and provide electric energy for operation of the sound box 2. The lower cover 27 is used to cooperate with the housing 22 to prevent dust from entering the sound generating device 21 and prolong a service life of the sound box. The fastener 28 is located between the soft rubber pad 213 and the lower cover 27 to fix the soft rubber pad 213 and the lower cover 27.

The above embodiments are only the preferred embodiments of the present disclosure, and are not intended to limit the protection scope of the present disclosure. Any modifications, equivalent replacements, improvements, etc. made within the spirit and principles of the present disclosure should be included within the protection scope of the present disclosure.

What is claimed is:
1. A display panel, comprising:
    a screen body;
    a cover plate, stacked with the screen body;
    a protrusion portion, disposed on a surface of a side, closer to the screen body, of the cover plate;
    a first adhesive portion, disposed between the cover plate and the screen body and covering a region of the cover plate exposed from the protrusion portion; and
    a second adhesive portion, filled between the protrusion portion and the screen body.

2. The display panel according to claim 1, wherein a material of the first adhesive portion and a material of the second adhesive portion are the same.

3. The display panel according to claim 1, wherein the first adhesive portion and the second adhesive portion are an integrated structure, and the integrated structure, after a defoaming treatment, is bonded to the screen body.

4. The display panel according to claim 2, wherein the first adhesive portion and the second adhesive portion are two individual structures, and a thickness of the first adhesive portion is larger than a thickness of the second adhesive portion.

5. The display panel according to claim 1, wherein a sum of a height of the protrusion portion and a thickness of the second adhesive portion is equal to a thickness of the first adhesive portion.

6. The display panel according to claim 1, wherein the first adhesive portion comprises a transparent adhesive.

7. The display panel according to claim 6, wherein the first adhesive portion comprises an optical adhesive.

8. The display panel according to claim 1, wherein the second adhesive portion comprises a foam tape.

9. The display panel according to claim 1, wherein the screen body comprises a flexible screen body.

10. The display panel according to claim 1, wherein a material of the protrusion portion comprises ink.

11. The display panel according to claim 1, wherein a thickness of the protrusion portion ranges from 0.05 mm to 0.2 mm.

12. The display panel according to claim 1, wherein the screen body comprises a display area and a non-display area surrounding the display area and used for wiring, and a projection of the protrusion portion on a plane of the screen body covers the non-display area.

13. A sound box, comprising:
   a sound generating device, used for generating sound;
   a housing, accommodating the sound generating device; and
   a display panel according to claim 1, disposed on a surface of the housing.

14. The sound box according to claim 13, wherein the sound generating device comprises:
   at least one electromagnetic vibration exciter, used for generating vibration;
   a soundboard, fitted with the electromagnetic vibration exciter for transmitting the vibration generated by the electromagnetic vibration exciter; and
   a soft rubber pad, bonded with a surface of the soundboard away from the electromagnetic vibration exciter, used for generating resonant sound with the soundboard.

15. The sound box according to claim 14, wherein the at least one electromagnetic vibration exciter comprises
   two electromagnetic vibration exciters, respectively located at both ends of the housing;
   wherein the housing comprises a plurality of holes distributed on surfaces of both ends of the housing.

* * * * *